(12) United States Patent
Kim et al.

(10) Patent No.: US 11,784,162 B2
(45) Date of Patent: Oct. 10, 2023

(54) SEMICONDUCTOR PACKAGE INCLUDING VERTICAL INTERCONNECTOR

(71) Applicant: SK hynix Inc., Icheon-si (KR)

(72) Inventors: Tae Hoon Kim, Icheon-si (KR); Chae Sung Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 65 days.

(21) Appl. No.: 17/154,705

(22) Filed: Jan. 21, 2021

(65) Prior Publication Data

US 2022/0059503 A1    Feb. 24, 2022

(30) Foreign Application Priority Data

Aug. 19, 2020    (KR) .................. 10-2020-0103950

(51) Int. Cl.
| | |
|---|---|
| *H01L 25/065* | (2023.01) |
| *H01L 23/31* | (2006.01) |
| *H01L 23/498* | (2006.01) |
| *H01L 23/00* | (2006.01) |

(52) U.S. Cl.
CPC ...... *H01L 25/0657* (2013.01); *H01L 23/3107* (2013.01); *H01L 23/49816* (2013.01); *H01L 23/49822* (2013.01); *H01L 24/16* (2013.01); *H01L 24/48* (2013.01); *H01L 2224/16227* (2013.01); *H01L 2224/48227* (2013.01); *H01L 2225/06562* (2013.01)

(58) Field of Classification Search
CPC ............. H01L 25/0657; H01L 23/3107; H01L 23/49816; H01L 23/49822; H01L 24/16; H01L 24/48; H01L 2224/16227; H01L 2224/48227; H01L 2225/06562; H10B 80/00
See application file for complete search history.

(56) References Cited

U.S. PATENT DOCUMENTS

| | | | | |
|---|---|---|---|---|
| 8,618,659 | B2 * | 12/2013 | Sato | H01L 21/4885 |
| | | | | 257/737 |
| 9,716,080 | B1 * | 7/2017 | Chuang | H01L 25/50 |
| 2002/0177296 | A1 * | 11/2002 | Ball | H01L 24/48 |
| | | | | 438/123 |

(Continued)

*Primary Examiner* — Timor Karimy
(74) *Attorney, Agent, or Firm* — WILLIAM PARK & ASSOCIATES LTD.

(57) ABSTRACT

A semiconductor package includes at least one semiconductor chip disposed in such a way that an active surface with chip pads faces a redistribution layer, vertical interconnectors extending in a vertical direction from the chip pads toward the redistribution layer, wherein each of the vertical connectors has a first end portion that is connected to a corresponding chip pad and a second end portion that is disposed on an opposite end of each vertical interconnector in relation to the first end portion, and a molding layer covering the semiconductor chip and the vertical interconnectors while exposing a surface of each of the second end portions of the vertical interconnectors, wherein the redistribution layer is formed over the molding layer, the redistribution layer having a redistribution land that is in contact with the surface of the second end portion, and wherein a width of the surface of the second end portion is greater than a width of an extension portion between the first end portion and the second end portion of each vertical interconnector.

13 Claims, 17 Drawing Sheets

(56) References Cited

U.S. PATENT DOCUMENTS

| | | | |
|---|---|---|---|
| 2006/0091518 A1* | 5/2006 | Grate | H01L 25/0657 |
| | | | 257/E23.07 |
| 2019/0229092 A1* | 7/2019 | Ding | H01L 24/13 |
| 2020/0020638 A1* | 1/2020 | Heo | H01L 23/5386 |
| 2020/0043889 A1 | 2/2020 | Huang et al. | |
| 2021/0167039 A1* | 6/2021 | Zeng | H01L 23/5384 |

* cited by examiner

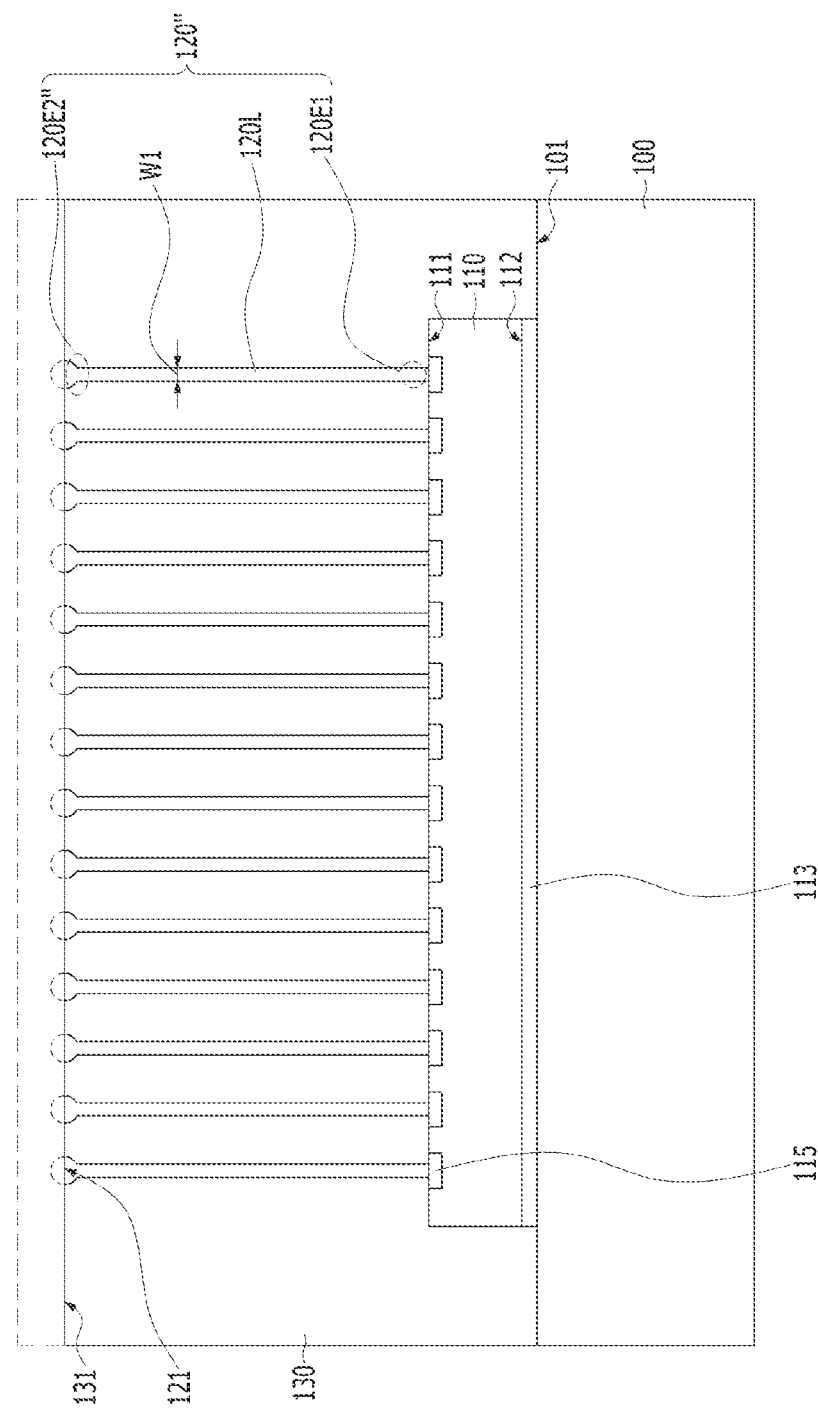

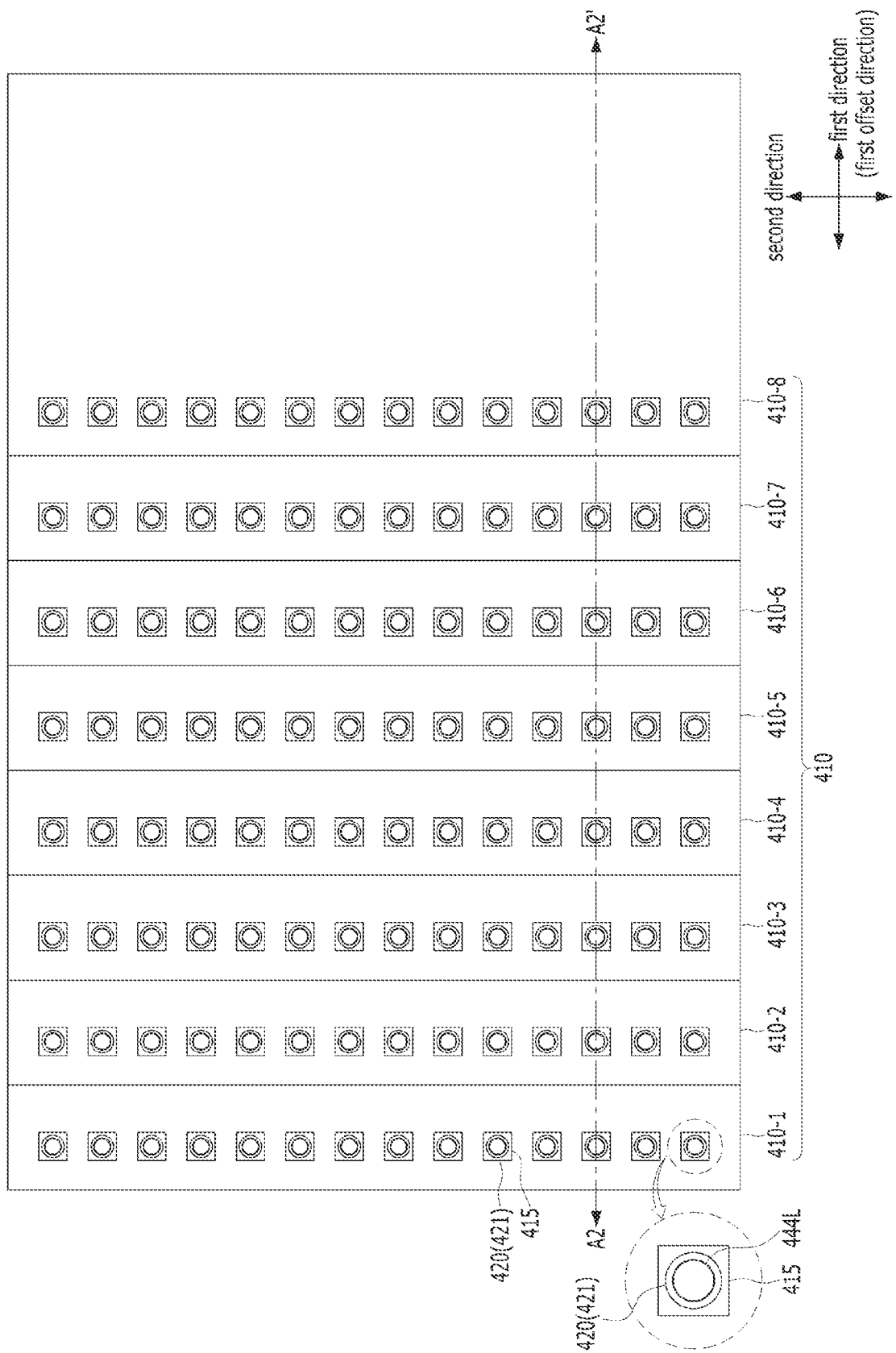

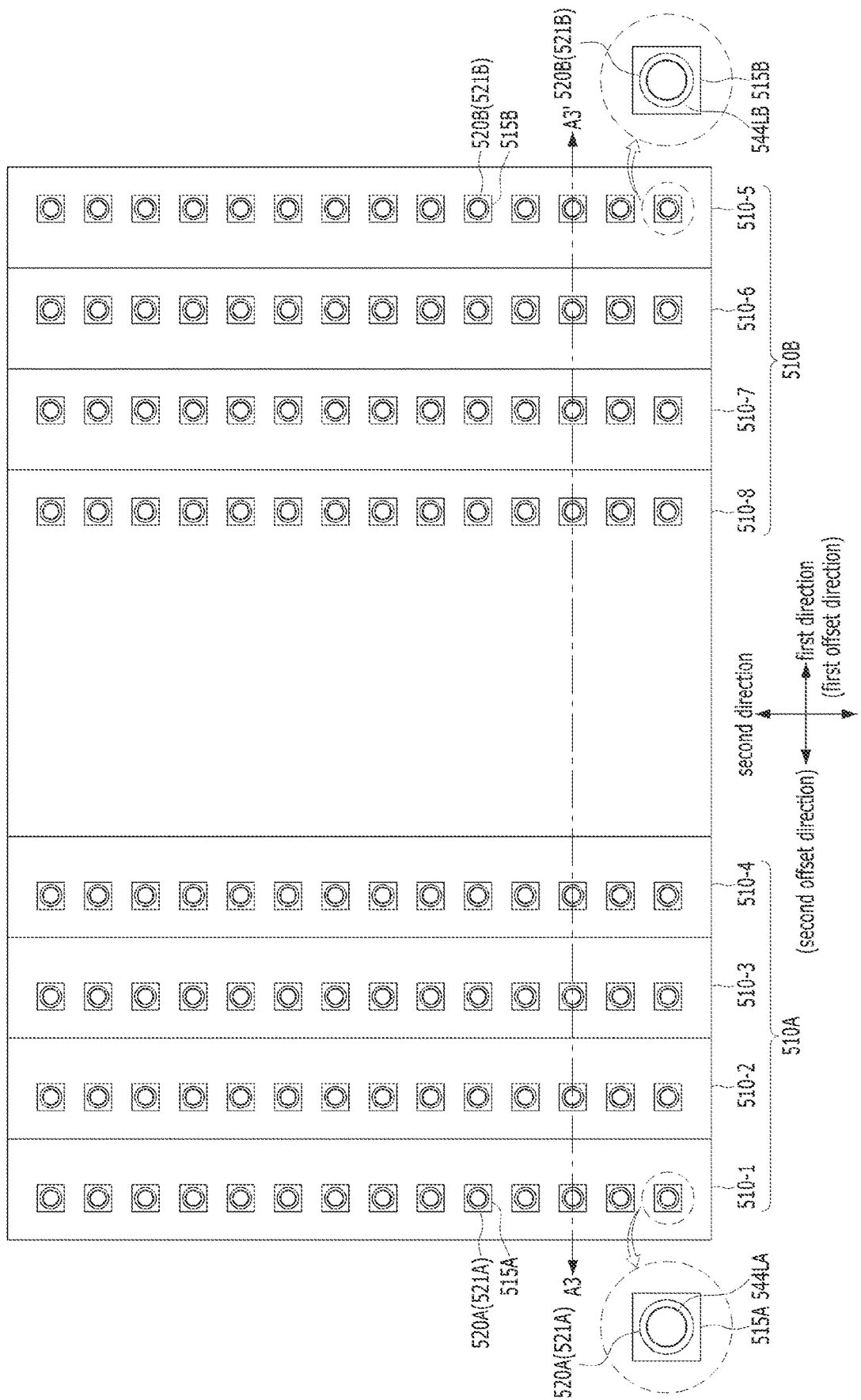

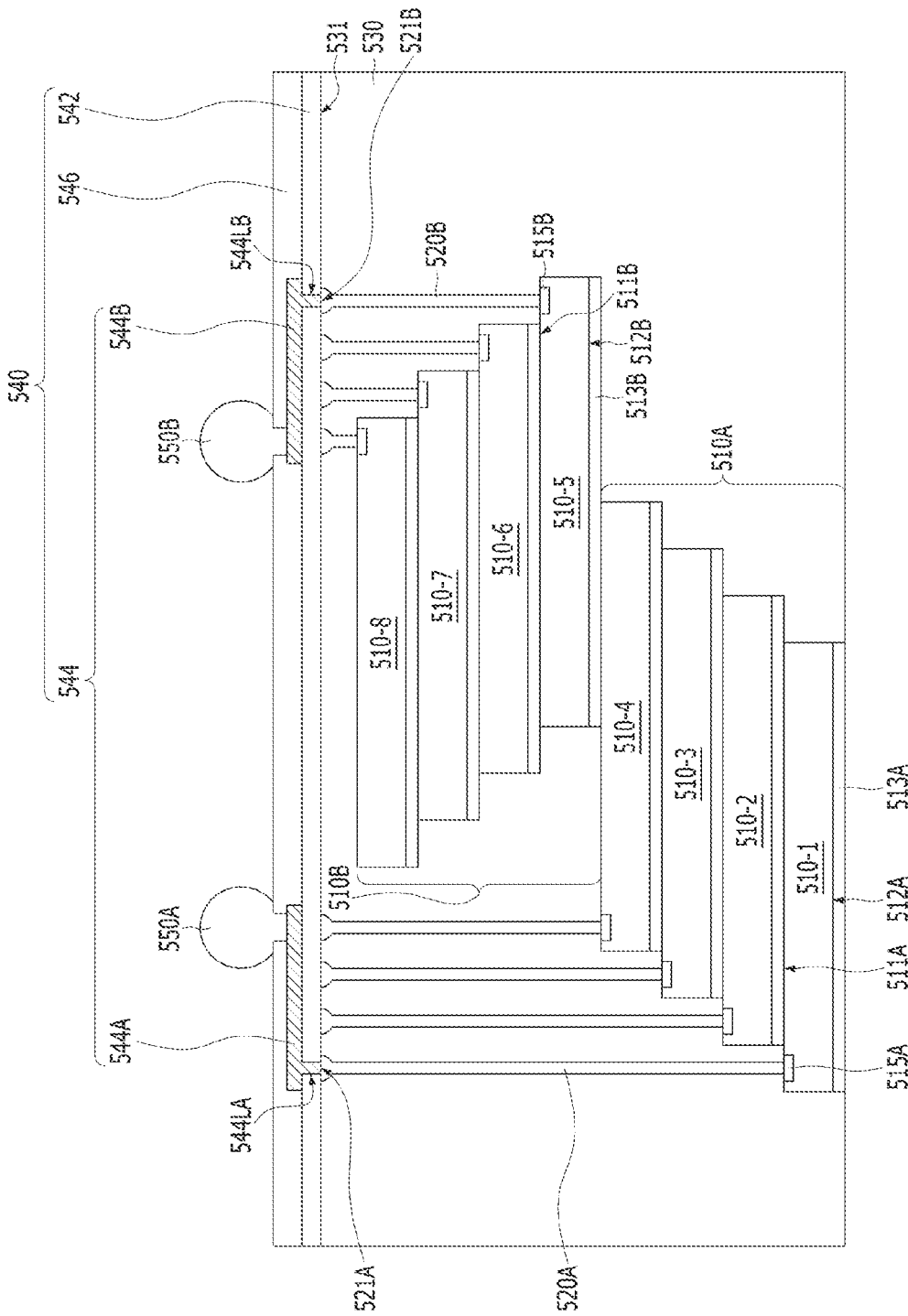

US 11,784,162 B2

SEMICONDUCTOR PACKAGE INCLUDING VERTICAL INTERCONNECTOR

CROSS-REFERENCE TO RELATED APPLICATION

This application claims priority under 35 U.S.C. § 119 to Korean Patent Application No. 10-2020-0103950 filed on Aug. 19, 2020, which is incorporated herein by reference in its entirety.

BACKGROUND

1. Technical Field

This patent document relates to a semiconductor package, and more particularly, to a semiconductor package including a vertical interconnector.

2. Related Art

Electronic products require high performance/high-volume data processing while constantly working to decrease the size of the products. Accordingly, a semiconductor package that is used in such electronic products are also required to have a specified size or smaller.

Recently, a fan-out package that uses vertical wires has been proposed. Since this fan-out package uses a redistribution layer instead of a conventional substrate, it is possible to implement a thinner semiconductor package.

SUMMARY

In an embodiment, a semiconductor package may include: at least one semiconductor chip disposed in such a way that an active surface with chip pads faces a redistribution layer; vertical interconnectors extending in a vertical direction from the chip pads toward the redistribution layer, wherein each of the vertical interconnectors has a first end portion that is connected to a corresponding chip pad and a second end portion that is disposed on an opposite end of each vertical interconnector in relation to the first end portion; and a molding layer covering the semiconductor chip and the vertical interconnectors while exposing a surface of the second end portion of each vertical interconnector, wherein the redistribution layer is formed over the molding layer, the redistribution layer having a redistribution land that is in contact with the surface of the second end portion, and wherein a width of the surface of the second end portion is greater than a width of an extension portion between the first end portion and the second end portion of each vertical interconnector.

In another embodiment, a method for fabricating a semiconductor package, may include: forming at least one semiconductor chip over a carrier substrate in such a way that an active surface with chip pads of the at least one semiconductor chip faces away from the carrier substrate; forming vertical interconnectors, extending in a vertical direction from the chip pads, wherein each of the vertical interconnectors has a first end portion that is connected to a corresponding chip pad and a second end portion that is disposed on an opposite end of each vertical interconnector in relation to the first end portion; forming a molding layer that covers the semiconductor chip and the vertical interconnectors while exposing a surface of the second end portion of each vertical interconnector; and forming a redistribution layer that is formed over the molding layer, the redistribution layer having a redistribution land that contacts the surface of the second end portion, wherein a width of the surface of the second end portion is greater than a width of an extension portion between the first end portion and the second end portion of each vertical interconnector.

BRIEF DESCRIPTION OF THE DRAWINGS

FIGS. 1A, 1B, 2A, 2B, 3A, 3B, 4A, and 4B are views, illustrating a semiconductor package and a method for fabricating the same, according to an embodiment of the present disclosure.

FIG. 7A is a plan view, illustrating a semiconductor package, according to another embodiment of the present disclosure.

FIG. 8A is a plan view, illustrating a semiconductor package, according to another embodiment of the present disclosure.

FIG. 8B is a cross-sectional view that is taken along a line A3-A3" of FIG. 8A.

DETAILED DESCRIPTION

Figure 1A:
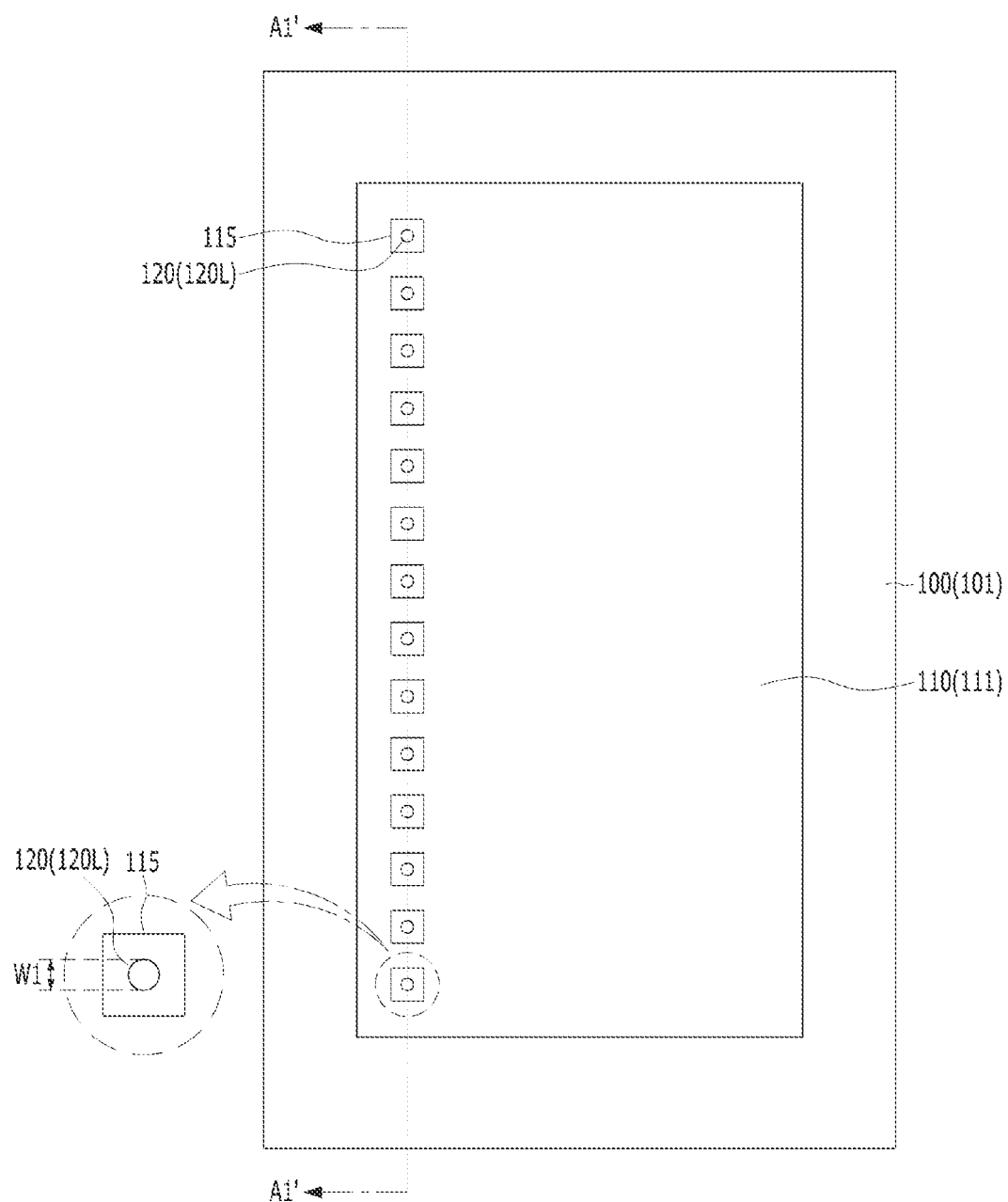

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 1A to 4B are views, illustrating a semiconductor package and a method for fabricating the same, according to an embodiment of the present disclosure. Specifically, FIGS. 1A, 2A, 3A, and 4A are plan views of a semiconductor package as viewed from an active surface direction. FIGS. 1B, 2B, 3B, and 4B are cross-sectional views that correspond to FIGS. 1A, 2A, 3A, and 4A, respectively. In particular, FIGS. 1B, 2B, 3B, and 4B are cross-sectional views taken along a line A1-A1' of FIGS. 1A, 2A, 3A, and 4A, respectively.

First, a fabricating method will be described.

Figure 1B:
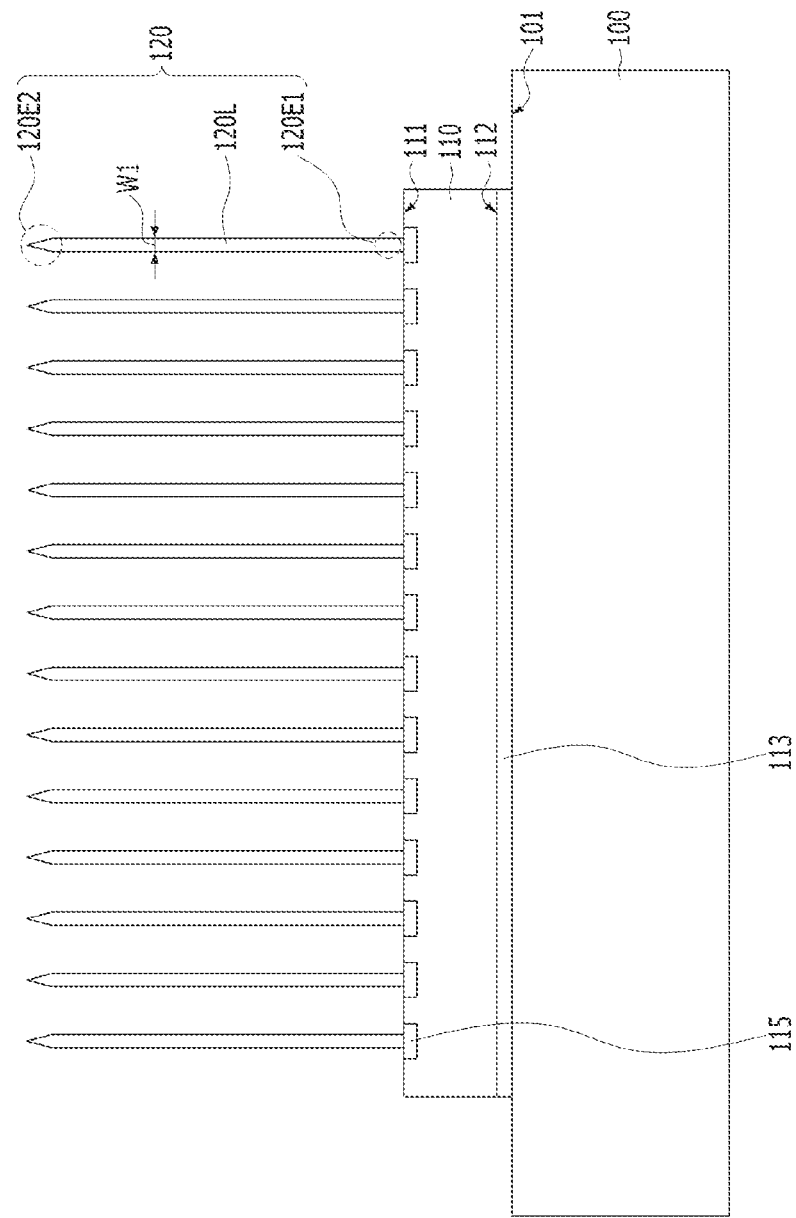

Referring to FIGS. 1A and 1B, a carrier substrate 100 may be provided. The carrier substrate 100 may be a glass carrier substrate, a silicon carrier substrate, a ceramic carrier substrate, or the like. Alternatively, the carrier substrate 100 may be a wafer, and a plurality of packages may be simultaneously formed over the carrier substrate 100.

Subsequently, a semiconductor chip 110 may be formed over one surface 101 of the carrier substrate 100.

The semiconductor chip 110 may include an active surface 111 on which chip pads 115 are disposed, an inactive surface 112 that is on the opposite side of the active surface 111, and side surfaces connecting the active surface 111 and the inactive surface 112. In the present embodiment, the semiconductor chip 110 may have a rectangular shape with four sides in a plan view. Further, in the present embodiment, the chip pads 115 may be disposed in an edge region that is adjacent to one side surface of the semiconductor chip 110. That is, the chip pads 115 may be disposed in an edge-pad type. Furthermore, the chip pads 115 may be arranged in a line along one direction in the edge region. However, the present disclosure is not limited thereto, and a region in which the chip pads 115 are disposed on the active surface 111 of the semiconductor chip 110 and an arrangement of the chip pads 115 in the region may be modified in various ways. In addition, in the present embodiment, the shape of the chip pad 115 is illustrated as a square in a plan view, but the present disclosure is not limited thereto, and the shape of the chip pad 115 in a plan view may be modified in various ways.

The semiconductor chip 110 may include nonvolatile memory, such as flash memory, phase-change random-access memory (PRAM), and magneto-resistive random-access memory (MRAM), volatile memory, such as dynamic random-access memory (DRAM) and static random-access memory (SRAM), non-memory, such as a logic circuit, or the like.

The semiconductor chip 110 may be formed over the carrier substrate 100 in a form in which the inactive surface 112 faces the one surface 101 of the carrier substrate 100 and the active surface 111, which is located on the opposite side of the inactive surface 112, faces away from the carrier substrate 100. An adhesive layer 113 may be formed on the inactive surface 112 of the semiconductor chip 110. The semiconductor chip 110 may be attached to the one surface 101 of the carrier substrate 100 by the adhesive layer 113. The adhesive layer 113 may include an insulating adhesive material, such as a die attach film (DAF).

Subsequently, initial vertical interconnectors 120 may be formed. The initial vertical interconnectors 120 may extend in a vertical direction and may be connected to the chip pads 115 of the semiconductor chip 110, respectively. The initial vertical interconnector 120 may include a first end portion 120E1 that is connected to the chip pad 115, an initial second end portion 120E2 that is on the opposite end of the initial vertical interconnector 120 in relation to the first end portion 120E1, and an extension portion 120L that is positioned to be between the first end portion 120E1 and the initial second end portion 120E2.

The initial vertical interconnector 120 may be, for example, a vertical bonding wire. When the initial vertical interconnector 120 is a vertical bonding wire, a brief description of the formation process thereof is as follows. First, one end of a wire may be bonded to the chip pad 115 by using a wire bonding machine (not shown). The wire may include a metal, such as gold, silver, copper, platinum, or an alloy thereof that can be welded to the chip pad 115 by ultrasonic energy and/or heat. Subsequently, the bonded wire may be pulled in a vertical direction away from the carrier substrate 100, for example, from bottom to top, by using the wire bonding machine. Then, when the wire is extended to a desired length, the wire may be cut. Accordingly, the initial vertical interconnector 120 in which the first end portion 120E1 is bonded to the chip pad 115 and the initial second end portion 120E2 is positioned to be at a predetermined height from the active surface 111, may be formed.

The extension portion 120L of the initial vertical interconnector 120 may have a first width W1 in a direction that is substantially parallel to the one surface 101 of the carrier substrate 100, that is, in a horizontal direction. As an example, the shape of the extension portion 120L of the initial vertical interconnector 120 in a plan view may be a circle, and in this case, the first width W1 may correspond to a diameter of the circle. The initial vertical interconnector 120 of FIG. 1A is shown at a predetermined height of the extension portion 120L of FIG. 1B. In this case, although not shown, the first end portion 120E1 may have a spherical shape with a larger width than the first width W1 through welding, or a shape that is similar to the spherical shape. On the other hand, the initial second end portion 120E2 may have a width that is less than or equal to the first width W1 by cutting, and may have a sharp upper part. As will be described later, when the width of a second end portion of a vertical interconnector is small, a connection failure between the vertical interconnector and a redistribution conductive layer may occur. Accordingly, in the present embodiment, by performing subsequent processes of FIGS. 2A to 3B, it is intended to reduce and/or prevent the occurrence of such failure.

Figure 2A:
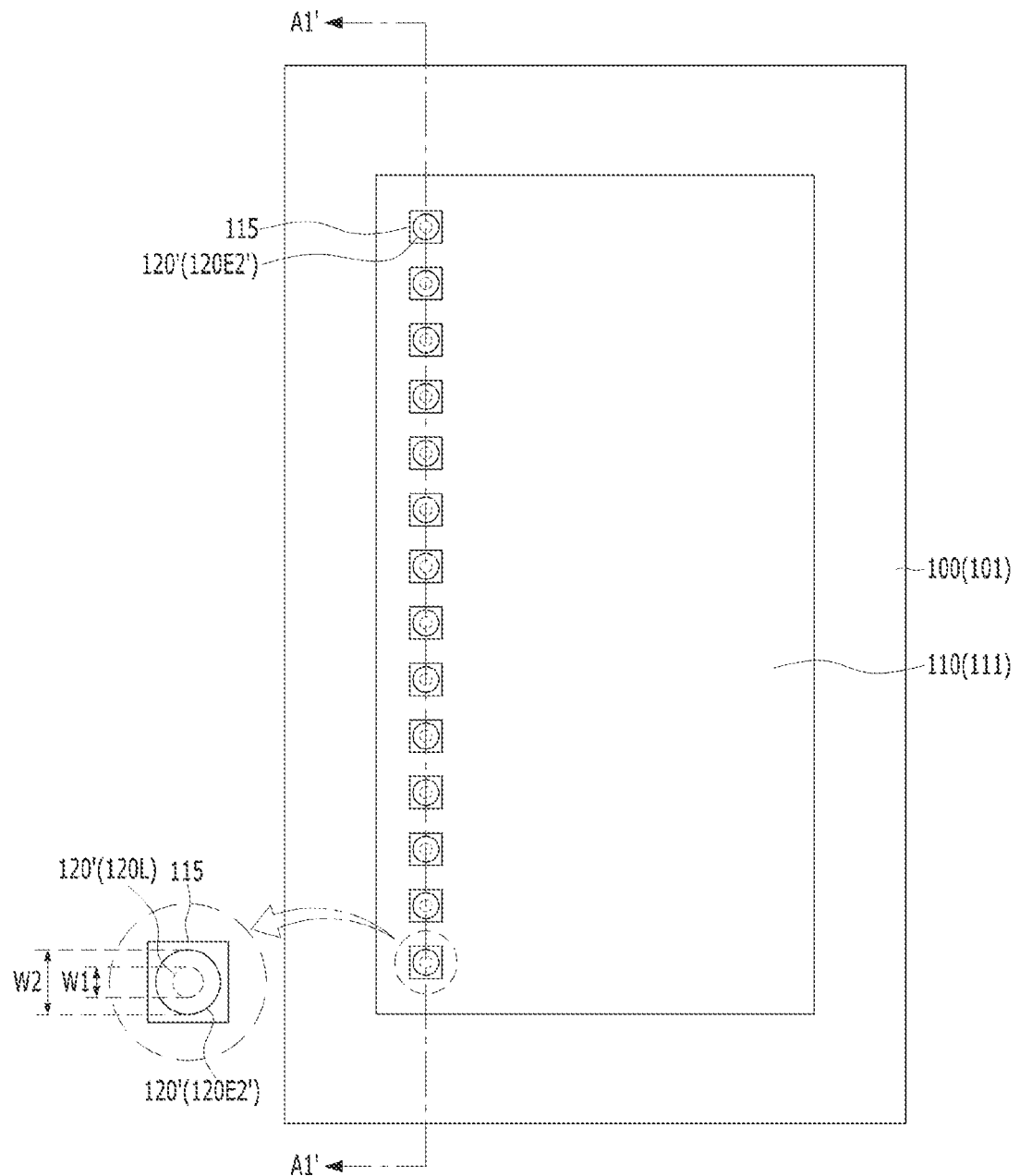
Figure 2B:
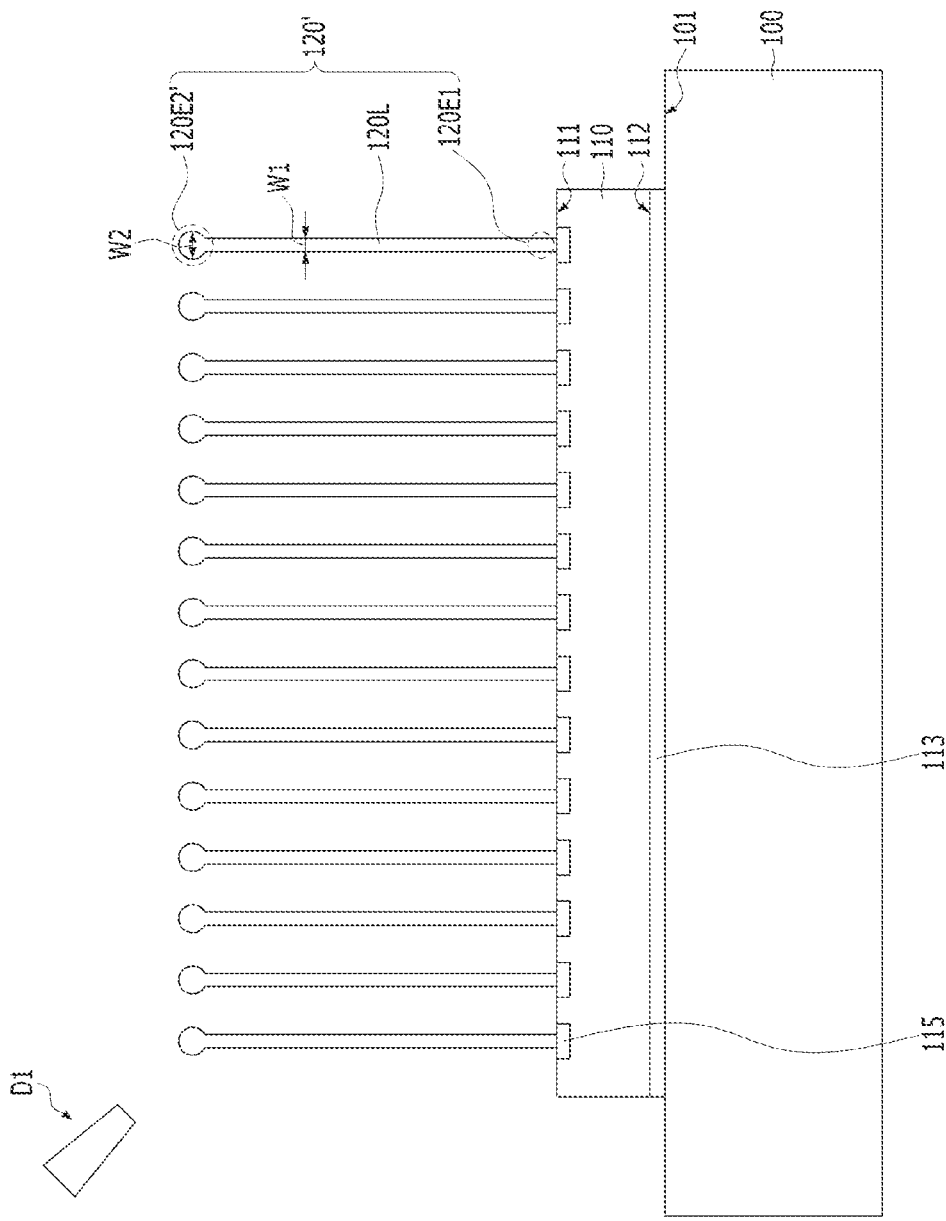

Referring to FIGS. 2A and 2B, a middle second end portion 120E2' may be formed by expanding the size of the initial second end portion 120E2. In this case, the sizes and shapes of the extension portion 120L and the first end portion 120E1 may be maintained. As a result, a middle vertical interconnector 120' with the first end portion 120E1, the extension portion 120L, and the middle second end portion 120E2' may be formed.

The process of forming the middle second end portion 120E2' may be performed by using an electronic flame off (EFO) unit D1. The EFO unit D1 may radiate a spark to the initial second end portion 120E2 in proximity to the initial second end portion 120E2. Accordingly, the middle second end portion 120E2' with an enlarged size compared to the initial second end portion 120E2 may be formed. As an example, the middle second end portion 120E2' may have a spherical shape or a similar shape. The middle second end portion 120E2' with a spherical shape or a similar shape may be referred to as a free air ball. However, the present disclosure is not limited thereto, and the middle second end portion 120E2' may have various three-dimensional shapes, such as a circular pillar. The maximum width of the middle second end portion 120E2' in the horizontal direction will be referred to as a second width W2 hereinafter. The second width W2 of the middle second end portion 120E2' may be greater than the first width W1 of the extension portion 120L. When the middle second end portion 120E2' has a spherical shape, the width that is measured horizontally through the center of the middle second end portion 120E2' may be the maximum width. When the middle second end portion 120E2' has a spherical shape, a planar shape that passes through the center of the middle second end portion 120E2' may be a circle, and the second width W2 may correspond to the diameter of the circle. The middle vertical interconnector 120' of FIG. 2A is shown at a height that corresponds to the second width W2 of FIG. 2B. In addition, for convenience of description, a portion with the first width W1 that corresponds to the extension portion 120L of the middle vertical interconnector 120' is also shown by a dotted line in FIG. 2A.

Figure 3A:
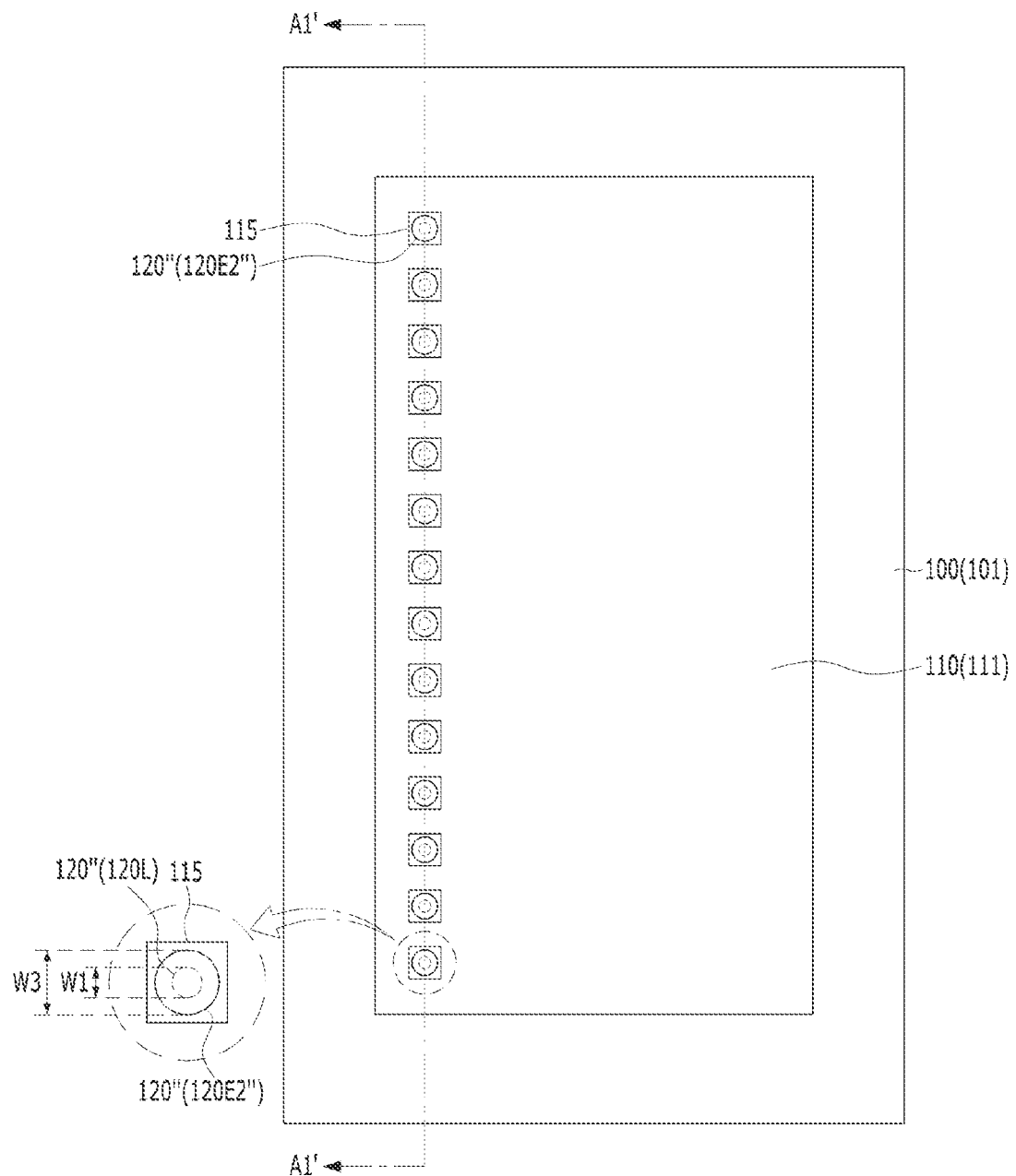

Referring to FIGS. 3A and 3B, a molding layer 130 may be formed by forming a molding material layer that covers the semiconductor chip 110 and the middle vertical interconnector 120' over the one surface 101 of the carrier substrate 100, and by performing a grinding process on the molding material layer until one surface of the middle second end portion 120E2' in the horizontal direction is exposed. Accordingly, the molding layer 130 may have one surface 131 that is located at substantially the same level as the exposed one surface of the middle second end portion 120E2' in the vertical direction. During the grinding process, a part of the middle second end portion 120E2', which exists over the one surface 131 of the molding layer 130, may be removed together with a part of the molding material layer, and as a result, a second end portion 120E2" with one surface 121 that is exposed by the molding layer 130 may be formed. That is, the one surface 121 of the second end portion 120E2" may be positioned to be at substantially the same level as the one surface 131 of the molding layer 130 in the vertical direction. The width of the one surface 121 of the second end portion 120E2" will be referred to as a third width W3 hereinafter. In this case, the sizes and shapes of the extension portion 120L and the first end portion 120E1 may be maintained. Accordingly, a vertical interconnector 120" with the first end portion 120E1, the extension portion 120L, and the second end portion 120E2", may be formed.

In the present embodiment, the grinding process for the molding material layer may be performed by targeting the one surface with the second width W2 of the middle second end portion 120E2". As will be described later, the larger the width of the one surface 121 of the second end portion 120E2" is, the more advantageous it is to connect to a redistribution layer. In this case, the third width W3 of the one surface 121 of the second end portion 120E2" may be substantially the same as the second width W2 of FIGS. 2A and 2B described above. However, the present disclosure is not limited thereto, and the third width W3 may have a value that is smaller than the second width W2 by a predetermined degree. Even in this case, the third width W3 may have a larger value than the first width W1.

For reference, in FIG. 3B, the part of the molding material layer and the part of the middle second end portion 120E2', which have been removed by grinding, are indicated by using dotted lines that are located over the molding layer 130 and the second end portion 120E2". The molding layer 130 may include a thermosetting resin, such as EMC (Epoxy Mold Compound). Further, the grinding process may be performed by mechanical polishing or chemical polishing.

When the middle second end portion 120E2' has a spherical shape or a similar shape, the second end portion 120E2" may have a hemispherical shape or a similar shape. In addition, as an example, the width of the second end portion 120E2" may increase as it goes upward, that is, as it approaches the one surface 121 in the vertical direction.

Figure 4A:
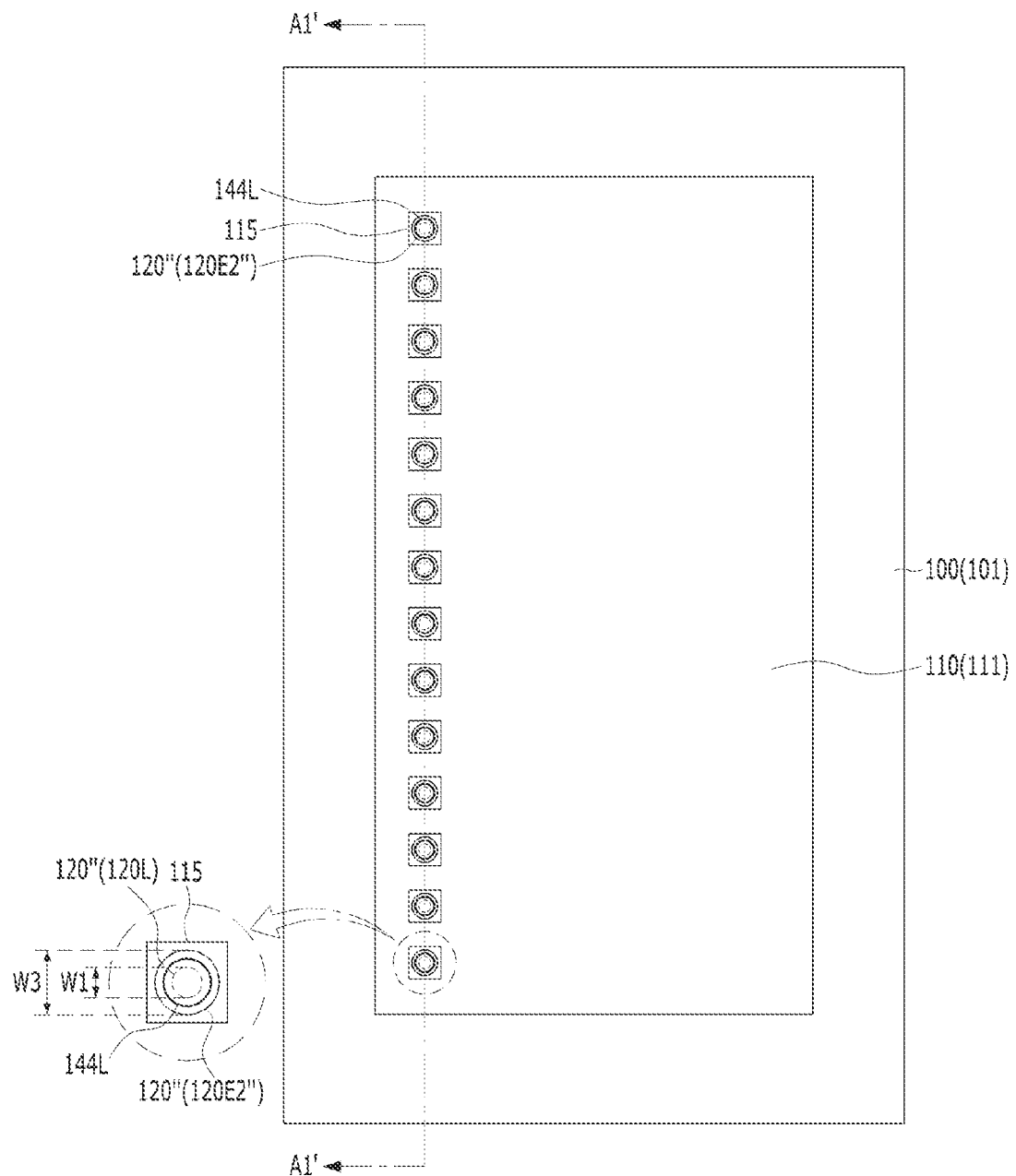
Figure 4B:
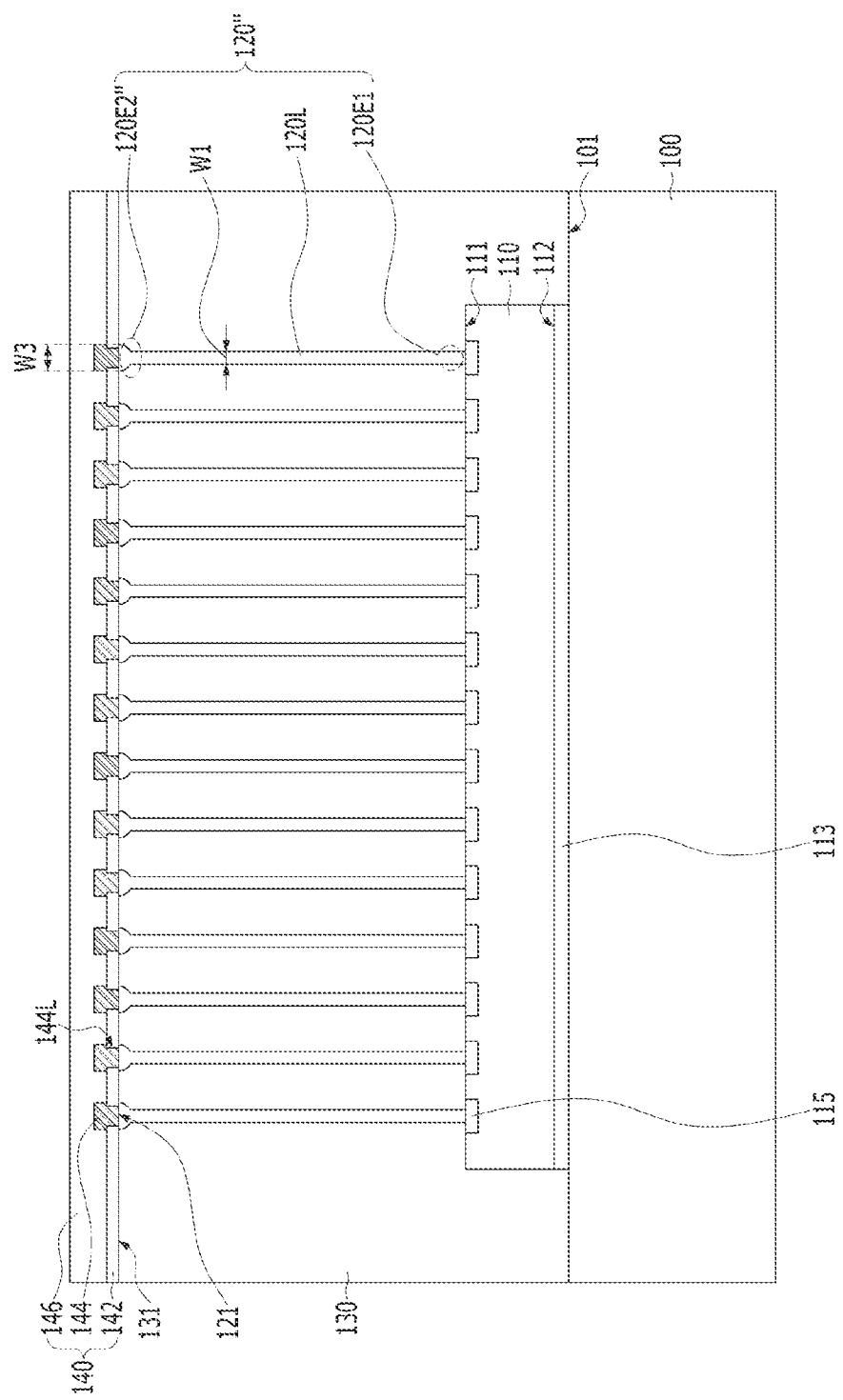

Referring to FIGS. 4A and 4B, a redistribution layer 140 may be formed over the one surface 131 of the molding layer 130 and the one surface 121 of the second end portion 120E2".

A portion of the redistribution layer 140, which contacts and is electrically connected to the second end portion 120E2", will be referred to as a redistribution land 144L. As an example, the redistribution layer 140 may include a first redistribution insulating layer 142, a redistribution conductive layer 144, and a second redistribution insulating layer 146. The first redistribution insulating layer 142 may be formed over the one surface 131 of the molding layer 130 and may have an opening that exposes at least a part of the one surface 121 of the second end portion 120E2". The redistribution conductive layer 144 may extend over the first redistribution insulating layer 142 while filling the opening of the first redistribution insulating layer 142. In the present embodiment, a portion of the redistribution conductive layer 144 that is filled in the opening of the first redistribution insulating layer 142 may form the aforementioned redistribution land 144L. A plurality of redistribution lands 144L may be connected to a plurality of second end portions 120E2", respectively. The redistribution conductive layer 144 may have various planar shapes over the first redistribution insulating layer 142. However, for convenience of description, only the redistribution lands 144L are illustrated in the plan view of FIG. 4A and the overall shape of the redistribution conductive layer 144 is not illustrated. The second redistribution insulating layer 146 may cover the first redistribution insulating layer 142 and the redistribution conductive layer 144. Although not shown, the second redistribution insulating layer 146 may have an opening that exposes a part of the redistribution conductive layer 144, and an external connection terminal that is electrically connected to the redistribution conductive layer 144 through this opening may be further formed over the second redistribution insulating layer 146.

With respect to the chip pads 115 and the second end portions 120E2" of the vertical interconnectors 120", the relative arrangement and sizes of the redistribution lands 144L will be described in more detail in FIGS. 6A and 6B, which will be described later.

Meanwhile, although not shown, the carrier substrate 100 may be removed. The carrier substrate 100 may be removed at any time after the molding layer 130 is formed.

By the processes described above, the semiconductor package, illustrated in FIGS. 4A and 4B, may be fabricated.

The semiconductor package of the present embodiment may include the semiconductor chip 110 with a plurality of chip pads 115 on its active surface 111, a vertical interconnector 120" extending in the vertical direction while being connected to each of the plurality of chip pads 115, a molding layer 130 exposing the one surface 121 of the vertical interconnector 120" while covering the semiconductor chip 110 and the vertical interconnector 120", and a redistribution layer 140 that is formed over the molding layer 130 and electrically connected to the vertical interconnector 120".

The vertical interconnector 120" may include a first end portion 120E1 that is connected to a chip pad 115, the second end portion 120E2" that is located on the opposite end of the vertical interconnector 120" in relation to the first end portion 120E1 and having the one surface 121 that is positioned to be at substantially the same level as the one surface 131 of the molding layer 130, and the extension portion 120L that is between the first end portion 120E1 and the second end portion 120E2". In this case, the third width W3 of the one surface 121 of the second end portion 120E2" may be greater than the first width W1 of the extension portion 120L. Furthermore, the third width W3 may be greater than the widths of any other portion of the second end portion 120E2" in the horizontal direction.

The redistribution layer 140 may include the redistribution conductive layer 144, which extends over the molding layer 130. The redistribution conductive layer 144 may include the redistribution land 144L, overlapping and connecting with the one surface 121 of the second end portion 120E2". As a result, the redistribution layer 140 may be electrically connected to the vertical interconnector 120".

Each of the above components of the semiconductor package has already been described in the fabricating method, and thus detailed descriptions thereof will be omitted.

According to the above described semiconductor package and its fabricating method, the following effects may be obtained.

First, by using the vertical interconnector 120" and forming a fan-out package using the redistribution layer 140 instead of a conventional substrate, a semiconductor package with a thin thickness may be implemented.

Furthermore, by increasing the third width W3 and/or the size of the one surface 121 of the second end portion 120E2" of the vertical interconnector 120", the alignment margin with the redistribution land 144L may be increased. Accordingly, a connection failure between the vertical interconnector 120" and the redistribution layer 140 may be reduced and/or prevented. In particular, when the vertical interconnector 120" is a vertical bonding wire and a sweeping of the vertical interconnector 120" occurs, a connection failure between the vertical interconnector 120" and the redistribution layer 140 may pose a big problem. However, this problem may be prevented. The sweeping phenomenon of the vertical bonding wire will be exemplarily described with reference to FIG. 5 below.

Figure 5:
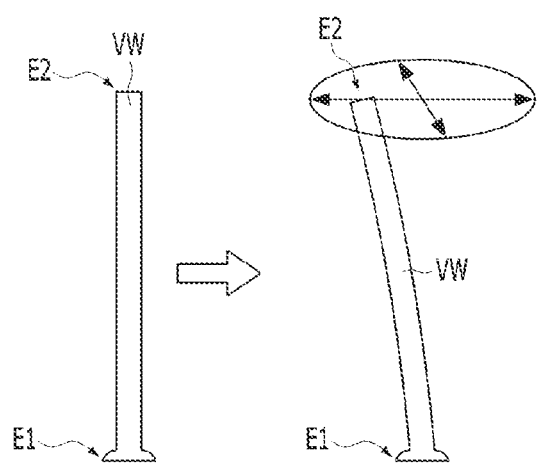
FIG. 5 is a view, illustrating a sweeping phenomenon of a vertical bonding wire.

FIG. 5 is a view, illustrating a sweeping phenomenon of a vertical bonding wire.

Referring to FIG. 5, a vertical bonding wire VW may have one end E1, attached to a chip pad, and the other end E2, located on the opposite side of the vertical bonding wire VW in relation to the one end E1.

At the left side of the arrow, a state immediately after the vertical bonding wire VW is formed, is shown. In other words, a state immediately after cutting a wire by using a wire bonding machine in a wire bonding process, is shown. The vertical bonding wire VW may maintain a state in which it stands vertically as long as no external force acts.

At the right side of the arrow, a state after an external force, such as pressure due to the flow of a molding material during a molding process being applied to the vertical bonding wire VW, is shown. When the pressure is applied, the one end E1 of the vertical bonding wire VW may be attached to the chip pad and fixed so it does not move. However, the other end E2 of the vertical bonding wire VW might not be fixed, and may move along a direction in which the pressure is applied. As a result, a sweeping phenomenon in which the vertical bonding wire VW is bent may occur. The displacement of the other end E2 of the vertical bonding wire VW occurring as a result of the sweeping phenomenon may be, for example, an arbitrary position in the concentric circle shown in this figure. The displacement of the other end E2 of the vertical bonding wire VW may change based on the injection direction, the direction of the pressure of the molding material, and the whirlpool of the molding material due to the surrounding structure. Meanwhile, such a sweeping phenomenon may be intensified as the length of the vertical bonding wire VW increases. When the sweeping of the vertical bonding wire VW occurs, the position of the other end E2 of the vertical bonding wire VW may be changed, so a component (not shown), to be connected to the other end E2 of the vertical bonding wire VW, for example, a redistribution layer, may be misaligned with the other end E2 of the vertical bonding wire VW. As a result, a connection failure between the vertical bonding wire VW and the component, for example, the redistribution layer may occur.

Referring back to FIGS. 4A and 4B, even if the vertical interconnector 120" is bent and the position of the second end portion 120E2" of the vertical interconnector 120" is changed, the misalignment between the vertical interconnector 120" and the redistribution layer 140 may be reduced and/or prevented by increasing the size of the second end portion 120E2".

This will be described in more detail with reference to FIGS. 6A to 6C below.

Figure 6A:
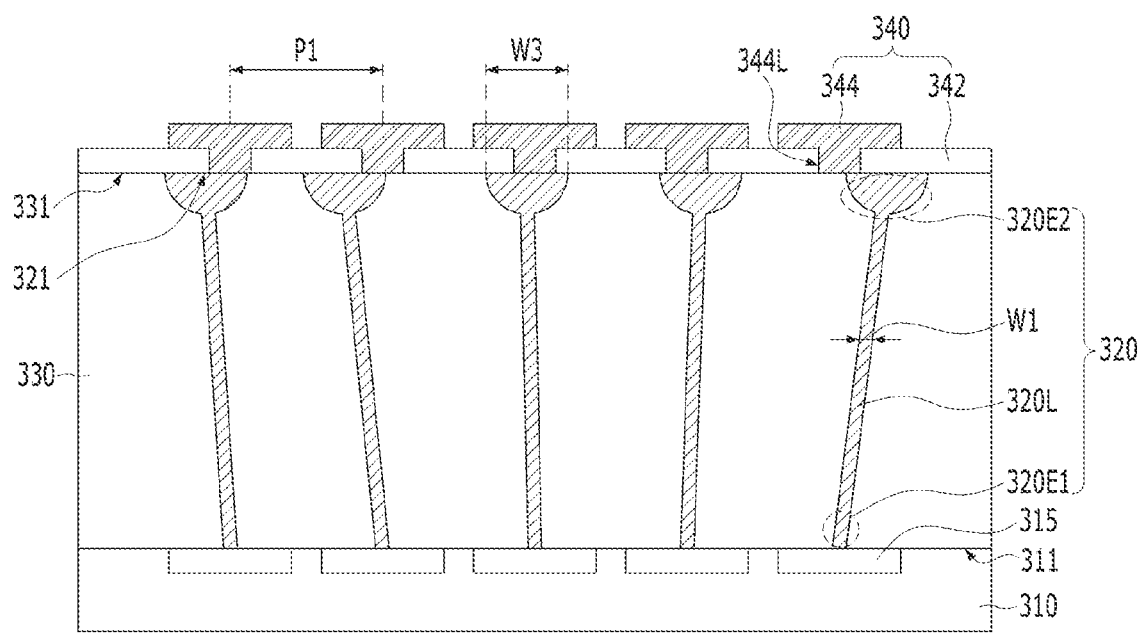
FIG. 6A is a cross-sectional view, illustrating a semiconductor package, according to another embodiment of the present disclosure.
Figure 6B:
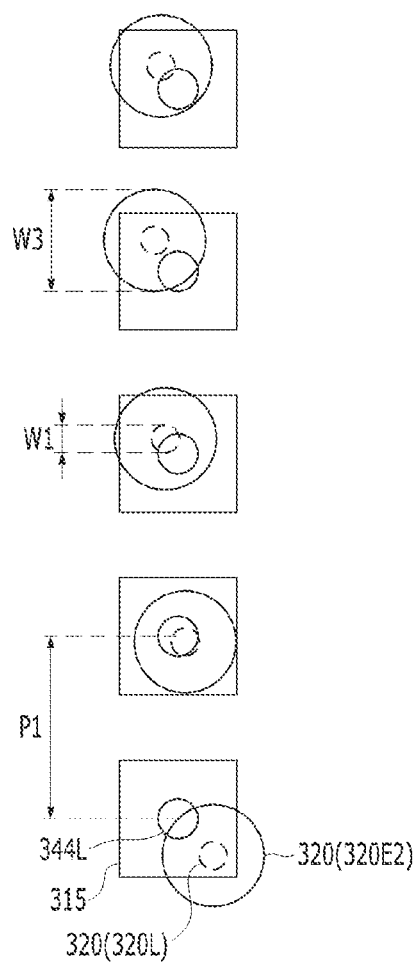
FIG. 6B is a plan view of the semiconductor package that corresponds to FIG. 6A.

FIG. 6A is a cross-sectional view, illustrating a semiconductor package, according to another embodiment of the present disclosure, and FIG. 6B is a plan view of the semiconductor package that corresponds to FIG. 6A. FIG. 6C is a cross-sectional view, illustrating a semiconductor package of a comparative example for comparison with the semiconductor package of FIGS. 6A and 6B. The semiconductor package of FIGS. 6A and 6B may be substantially the same as the semiconductor package of FIGS. 4A and 4B described above, but shows a case in which a sweeping phenomenon of a vertical interconnector occurs in more detail. Unlike the semiconductor package of FIGS. 4A and 4B, the semiconductor package of FIG. 6C shows a case in which an end portion of a vertical interconnector is not expanded and a sweeping phenomenon of this vertical interconnector occurs.

Figure 6C:
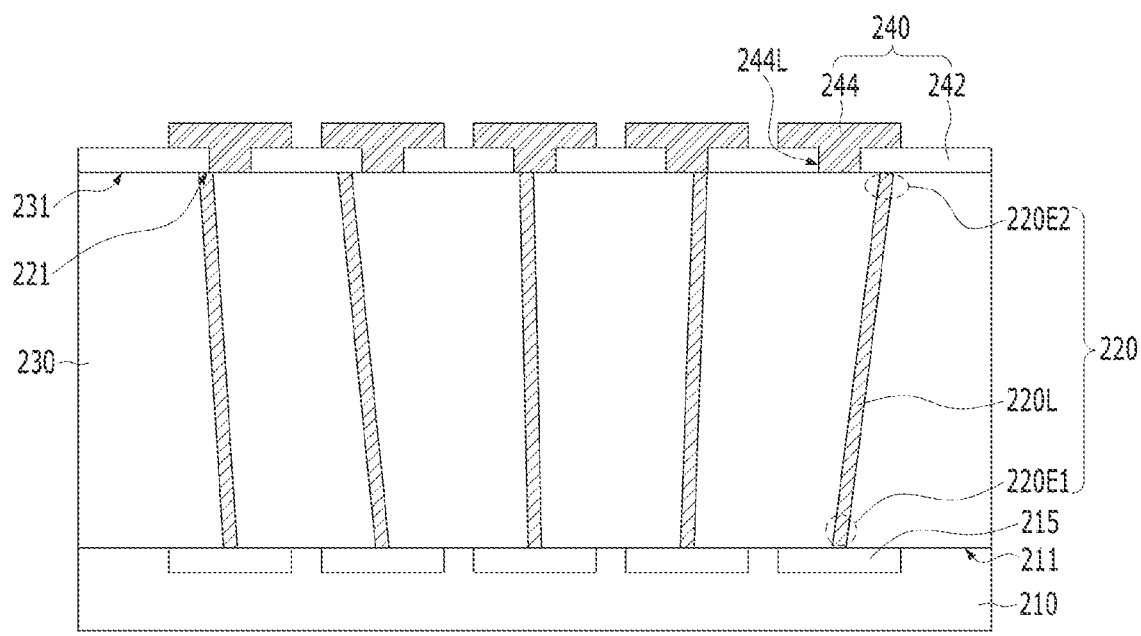
FIG. 6C is a cross-sectional view, illustrating a semiconductor package of a comparative example for comparison with the semiconductor package of FIGS. 6A and 6B.

First, referring to FIG. 6C, the semiconductor package of the comparative example may include a semiconductor chip 210 with a plurality of chip pads 215 on its active surface 211, vertical interconnectors 220 extending in a vertical direction while being connected to the plurality of chip pads 215, respectively, a molding layer 230 exposing one surface 221 of each of the vertical interconnectors 220 while covering the semiconductor chip 210 and the vertical interconnectors 220, and a redistribution layer 240 that is disposed over the molding layer 230 and electrically connected to the vertical interconnectors 220.

Each of the vertical interconnectors 220 may include a first end portion 220E1 that is connected to the chip pad 215, a second end portion 220E2 that is located on the opposite end of each of the vertical interconnectors 220 in relation to the first end portion 220E1 in the vertical direction with the one surface 221 that is positioned to be at substantially the same level as one surface 231 of the molding layer 230, and an extension portion 220L between the first end portion 220E1 and the second end portion 220E2. In this case, the width of the one surface 221 of the second end portion 220E2 may be equal to or smaller than the width of the extension portion 220L.

The redistribution layer 240 may include a first redistribution insulating layer 242 and redistribution conductive layer 244 that are formed over the first redistribution insulating layer 242. The first redistribution insulating layer 242 may have an opening that exposes at least a portion of the one surface 221 of the second end portion 220E2. The redistribution conductive layer 244 may extend over the first redistribution insulating layer 242 while filling the opening. A portion of the redistribution conductive layer 244, which is filled in the opening and is connected to the one surface 221 of the second end portion 220E2, may be referred to as a redistribution land 244L.

In this case, when the vertical interconnector 220 is bent, the position of the second end portion 220E2 of the vertical interconnector 220 may be changed. Because the first end portion 220E1 is bonded to and fixed to the chip pad 215, its position might not be changed.

When the degree of change in the position of the second end portion 220E2 of the vertical interconnector 220 increases, the positions of the redistribution land 244L and the second end portion 220E2 may be shifted so that they might not contact each other (refer to first, second and fifth vertical interconnectors 220 from the left side of FIG. 6C).

On the other hand, referring to FIGS. 6A and 6B, the semiconductor package of the present embodiment may include a semiconductor chip 310 with a plurality of chip pads 315 on its active surface 311, vertical interconnectors 320 extending in a vertical direction while being connected to the plurality of chip pads 315, respectively, a molding layer 330 exposing one surface 321 of each of the vertical interconnectors 320 while covering the semiconductor chip 310 and the vertical interconnectors 320, and a redistribution layer 340 that is disposed over the molding layer 330 and electrically connected to the vertical interconnectors 320.

Each of the vertical interconnectors 320 may include a first end portion 320E1 that is connected to the chip pad 315, a second end portion 320E2 located on the opposite end of each of the vertical interconnectors 320 in relation to the first end portion 320E1 in the vertical direction with the one surface 321 that is positioned to be at substantially the same level as one surface 331 of the molding layer 330, and an extension portion 320L between the first end portion 320E1 and the second end portion 320E2. In this case, the width W3 of the one surface 321 of the second end portion 320E2 may be greater than the width W1 of the extension portion 220L. This is because the second end portion 320E2 has an enlarged shape, such as a hemispherical shape through the processes of FIGS. 2A to 3B that are described above.

The redistribution layer 340 may include a first redistribution insulating layer 342 and a redistribution conductive layer 344 that are formed over the first redistribution insulating layer 342. The first redistribution insulating layer 342 may have an opening that exposes at least a portion of the one surface 321 of the second end portion 320E2. The redistribution conductive layer 344 may extend over the first redistribution insulating layer 342 while filling the opening. A portion of the redistribution conductive layer 344, which is filled in the opening and is connected to the one surface 321 of the second end portion 320E2, may be referred to as a redistribution land 344L.

In this case, when the vertical interconnector 320 is bent, the position of the second end portion 320E2 of the vertical interconnector 320 may be changed. Because the first end portion 320E1 is bonded to and fixed to the chip pad 315, its position might not be changed.

Even though the degree of positional variation of the second end portion 320E2 of the vertical interconnector 320 is large, contact between the redistribution land 344L and the second end portion 320E2 may be facilitated, compared to the comparative example of FIG. 6C. This is because the width W3 of the one surface 321 of the second end portion 320E2 is increased, compared to the comparative example of FIG. 6C.

A plurality of redistribution lands 344L may be disposed to have the same arrangement as the chip pads 315. That is, the centers of the chip pads 315 and the centers of the redistribution lands 344L may substantially coincide, and the redistribution lands 344L may be arranged to have substantially the same pitch as the pitch P1 of the chip pads 315. The center of the first end portion 320E1 of each of the plurality of vertical interconnectors 320 may overlap and connect with the center of the chip pad 315. On the other hand, the center of the second end portion 320E2 of at least one of the plurality of vertical interconnectors 320 may be shifted from the center of the chip pad 315 and/or the center of the redistribution land 344L. Even if the center of the second end portion 320E2 is shifted from the center of the redistribution land 344L, that is, even if a misalignment occurs between the center of the second end portion 320E2 and the center of the redistribution land 344L, the width W3 of the one surface 321 of the second end portion 320E2 may be relatively large enough to allow for a greater chance of contact and electrical connection between the second end portion 320E2 and the redistribution land 344L.

Meanwhile, in the embodiments of FIGS. 1A to 6B above, a semiconductor package with a single semiconductor chip has been described. However, the present disclosure is not limited thereto, and the present embodiments may also be applied to a semiconductor package with a plurality of semiconductor chips that are stacked in a vertical direction. This will be exemplarily described with reference to FIGS. 7A to 8B.

Figure 7B:
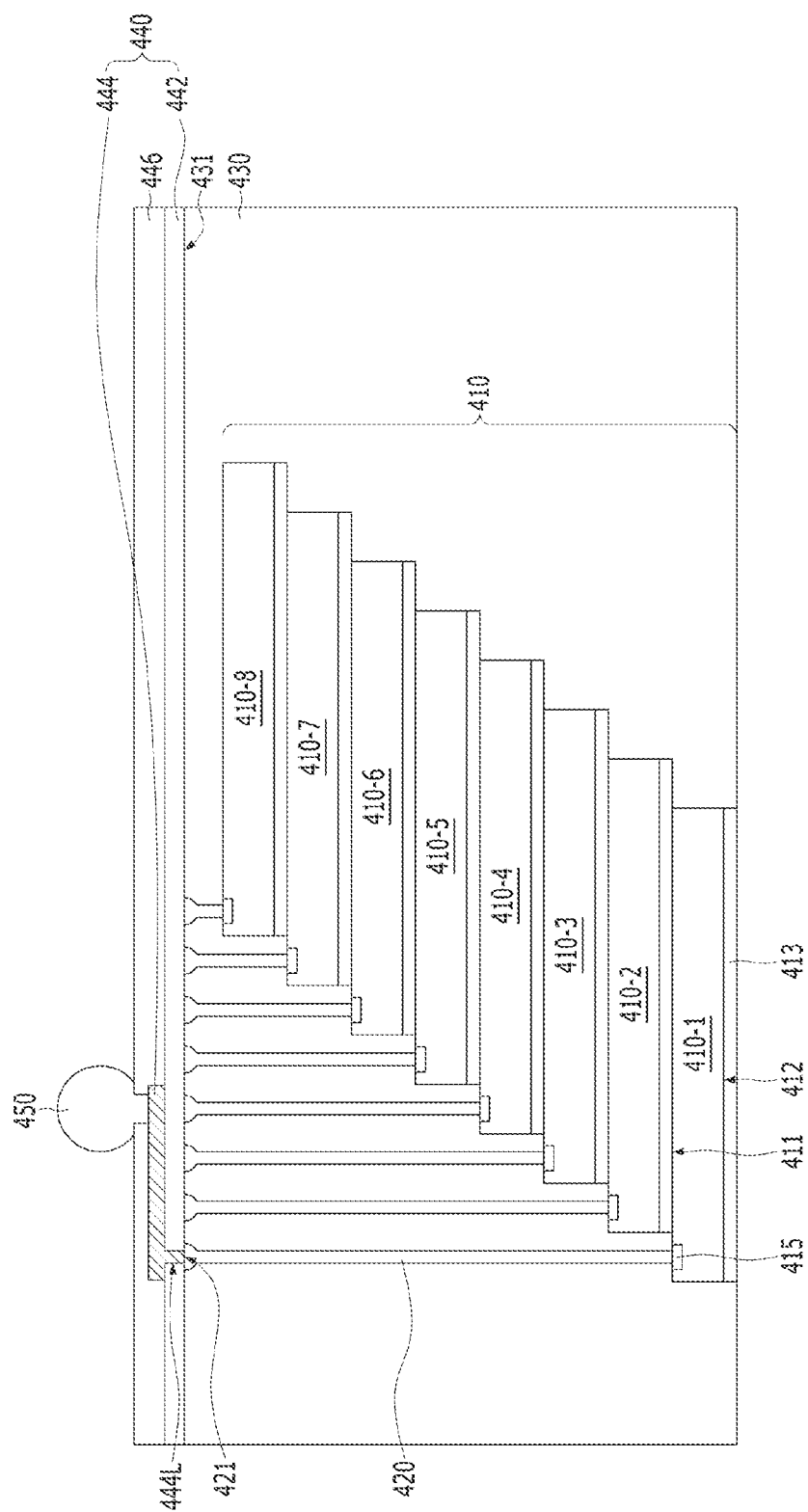
FIG. 7B is a cross-sectional view that is taken along a line A2-A2' of FIG. 7A.

FIG. 7A is a plan view, illustrating a semiconductor package according to another embodiment of the present disclosure, and FIG. 7B is a cross-sectional view that is taken along a line A2-A2' of FIG. 7A. For convenience of description, only a redistribution land 444L is illustrate in the plan view of FIG. 7A and the entire shape of the redistribution conductive layer 444 is omitted. Also, for convenience of description, only one redistribution conductive layer 444 that is connected to one vertical interconnector 420 is illustrated in the cross-sectional view of FIG. 7B. However, a plurality of redistribution conductive layers 444 that are connected to a plurality of vertical interconnectors 420, illustrated in the cross-sectional view of FIG. 7B, may be formed. Detailed descriptions of parts that are substantially the same as those of the above-described embodiments will be omitted.

Referring to FIGS. 7A and 7B, the semiconductor package of the present embodiment may include a chip stack 410 that includes a plurality of semiconductor chips 410-1 to 410-8, stacked in a vertical direction. In the present embodiment, the chip stack 410 may include eight semiconductor chips 410-1 to 410-8, but the present disclosure is not limited thereto, and the number of semiconductor chips included in the chip stack 410 may be modified in various ways.

Each of the semiconductor chips 410-1 to 410-8 may include an active surface 411 on which the chip pads 415 are disposed and an inactive surface 412 that is on the opposite side of the active surface 411. The chip pads 415 may be disposed at one of both edge regions of the active surface 411 in a first direction, for example, in a left edge region. Also, the chip pads 415 may be arranged in a line in a second direction crossing the first direction. However, the present disclosure is not limited thereto, and the arrangement of the chip pads 415 may be modified in various ways as long as the chip pads 415 are disposed in any one of the two edge regions in the first direction. An adhesive layer 413 may be formed on the inactive surface 412 of each of the semiconductor chips 410-1 to 410-8. The semiconductor chips 410-1 to 410-8 may be attached to the semiconductor chips 410-1 to 410-7 or a carrier substrate (not shown) located directly thereunder by using the adhesive layer 413.

The semiconductor chips 410-1 to 410-8 may be the same memory chips, such as NAND flash memory chips. However, the present disclosure is not limited thereto, and the semiconductor chips 410-1 to 410-8 may include various types of memory chips.

The semiconductor chips 410-1 to 410-8 may be stacked in in such a way that the active surface 411 faces the redistribution layer 440. In this case, the semiconductor chips 410-1 to 410-8 may be offset-stacked in a first offset direction, from one side that is adjacent to the chip pads 415 toward the other side that is opposite to the one side in the first direction, so that all the chip pads 415 of each of the semiconductor chips 410-1 to 410-8 are exposed. Both sidewalls of the semiconductor chips 410-1 to 410-8 may be aligned with each other in the second direction.

The vertical interconnector 420 may extend in a vertical direction and may have one end that is connected to each of the exposed chip pads 415 based on the offset-stacking of the semiconductor chips 410-1 to 410-8. The vertical interconnector 420 may be a vertical bonding wire. Alternatively, among the vertical interconnectors 420, the vertical interconnectors 420 that are connected to the uppermost semiconductor chip 410-8 may be conductive bumps, and the remaining vertical interconnectors 420 that are connected to the remaining semiconductor chips 410-1 to 410-7 may be vertical bonding wires.

The molding layer 430 may cover the chip stack 410 and the vertical interconnectors 420. In addition, one surface 421 of an end that is positioned on the opposite end of the vertical interconnectors 420 in relation to the one end that is connected to the chip pad 415 may be exposed through one surface 431 of the molding layer 430.

The redistribution layer 440 may be formed over the one surface 431 of the molding layer 430. The redistribution layer 440 may include a redistribution land 444L that is formed on the one surface 431 of the molding layer 430 to contact the one surface 421 of the vertical interconnector 420. Accordingly, the redistribution layer 440 and the vertical interconnector 420 may be electrically connected to each other. In the present embodiment, the redistribution layer 440 may include a first redistribution insulating layer 442, the redistribution conductive layer 444 formed over the first redistribution insulating layer 442 and is connected to the one surface 421 of the vertical interconnector 420 through the opening of the first redistribution insulating layer 442, and a second redistribution insulating layer 446 covering the first redistribution insulating layer 442 and the redistribution conductive layer 444. The redistribution land 444L may be a portion of the redistribution conductive layer 444.

An external connection terminal 450 may be connected to the redistribution conductive layer 444 through an opening that is formed in the second redistribution insulating layer 446.

According to the semiconductor package of the present embodiment, all of the effects of the above-described embodiment may be obtained.

Further, because a plurality of semiconductor chips are included in one semiconductor package, a semiconductor package that is capable of high performance/high-volume data processing may be implemented.

FIG. 8A is a plan view, illustrating a semiconductor package, according to another embodiment of the present disclosure, and FIG. 8B is a cross-sectional view that is taken along a line A3-A3' of FIG. 8A. For convenience of description, only first and second redistribution lands 544LA and 544LB are illustrated in the plan view of FIG. 8A, and entire shapes of first and second redistribution conductive layers 544A and 544B are omitted. In addition, for convenience of description, only one first redistribution conductive layer 544A that is connected to one first vertical interconnector 520A, and only one second redistribution conductive layer 544B that is connected to one second vertical interconnector 520B are illustrated in the cross-sectional view of FIG. 8B. However, a plurality of first and second redistribution conductive layers 544A and 544B that are connected to the plurality of first and second vertical interconnectors 520A and 520B, illustrated in the cross-sectional view of FIG. 8B, may be formed. Detailed descriptions of parts that are substantially the same as those of the above-described embodiments will be omitted.

Referring to FIGS. 8A and 8B, the semiconductor package of the present embodiment may include a first chip stack 510A and a second chip stack 510B that is disposed over the first chip stack 510A. The first chip stack 510A may include a plurality of first semiconductor chips 510-1 to 510-4 that are stacked in a vertical direction. The second chip stack 510B may include a plurality of second semiconductor chips 510-5 to 510-8 that are stacked in the vertical direction. In the present embodiment, each of the first and second chip stacks 510A and 510B may include four semiconductor chips, but the present disclosure is not limited thereto, and the number of semiconductor chips included in each of the first and second chip stacks 510A and 510B may be modified in various ways.

Each of the first semiconductor chips 510-1 to 510-4 may include an active surface 511A on which first chip pads 515A are disposed and an inactive surface 512A that is on the opposite side of the active surface 511A. The first chip pads 515A may be disposed at one of both edge regions of the active surface 511A in the first direction, for example, at a left edge region. Also, the first chip pads 515A may be arranged in a line in the second direction. However, the present disclosure is not limited thereto, and the arrangement of the first chip pads 515A may be modified in various ways as long as the first chip pads 515A are disposed in any one of both edge regions in the first direction. An adhesive layer 513A may be formed on the inactive surface 512A of each of the first semiconductor chips 510-1 to 510-4. The first semiconductor chips 510-1 to 510-4 may be attached to the first semiconductor chips 510-1 to 510-3 or a carrier substrate (not shown) located directly thereunder by the adhesive layer 513A.

The first semiconductor chips 510-1 to 510-4 may be the same memory chips, such as NAND flash memory chips. However, the present disclosure is not limited thereto, and the first semiconductor chips 510-1 to 510-4 may include various types of memory chips.

The first semiconductor chips 510-1 to 510-4 may be stacked in such a way that the active surface 511A faces the redistribution layer 540. In this case, the first semiconductor chips 510-1 to 510-4 may be offset-stacked in a first offset direction, from one side that is adjacent to the first chip pads 515A toward the other side that is opposite to the one side in the first direction so that all the first chip pads 515A of each of the first semiconductor chips 510-1 to 510-4 are exposed. Both sidewalls of the first semiconductor chips 510-1 to 510-4 may be aligned with each other in the second direction.

The first vertical interconnector 520A may extend in a vertical direction and may have one end that is connected to each of the exposed first chip pads 515A based on the offset-stacking of the first semiconductor chips 510-1 to 510-4. The first vertical interconnector 520A may be a vertical bonding wire.

Each of the second semiconductor chips 510-5 to 510-8 may include an active surface 511B on which second chip pads 515B are disposed and an inactive surface 512B that is on the opposite side of the active surface 511B. The second chip pads 515B may be disposed at one of two edge regions of the active surface 511B in the first direction, which is the opposite edge region compared to the first chip pads 515A (for example, at a right edge region). As an example, each of the second semiconductor chips 510-5 to 510-8 may be in a state in which any one of the first semiconductor chips 510-1 to 510-4 is rotated 180 degrees about an axis in the vertical direction. An adhesive layer 513B may be formed on the inactive surface 512B of each of the second semiconductor chips 510-5 to 510-8. The second semiconductor chips 510-5 to 510-8 may be attached to the second semiconductor chips 510-5 to 510-7 or the first chip stack 510A located directly thereunder by the adhesive layer 513B.

The second semiconductor chips 510-5 to 510-8 may be the same memory chips, such as NAND flash memory chips. Further, the second semiconductor chips 510-5 to 510-8 may be the same memory chips as the first semiconductor chips 510-1 to 510-4. However, the present disclosure is not limited thereto, and the second semiconductor chips 510-5 to 510-8 may include various types of memory chips.

The second semiconductor chips 510-5 to 510-8 may be stacked in such a way that the active surface 511B faces the redistribution layer 540. In this case, the second semiconductor chips 510-5 to 510-8 may be offset-stacked in the second offset direction, which is opposite to the first offset direction, so that all the second chip pads 515B of each of the second semiconductor chips 510-5 to 510-8 are exposed. In the second direction, both sidewalls of the second semiconductor chips 510-5 to 510-8 may be aligned with each other.

Further, the second chip stack 510B may be formed in such a way that all the first chip pads 515A of the first chip stack 510A are exposed. It may be possible in a manner of increasing a distance between the lowermost second semiconductor chip 510-5 of the second chip stack 510B and the uppermost first semiconductor chip 510-4 of the first chip stack 510A in the first direction, and/or reducing an offset between the second semiconductor chips 510-5 to 510-8 as possible.

The second vertical interconnector 520B may extend in a vertical direction, and may have one end that is connected to each of the exposed second chip pads 515B according to the offset-stacking of the second semiconductor chips 501-5 to 510-8. The second vertical interconnectors 520B may be vertical bonding wires. Alternatively, the second vertical interconnectors 520B that are connected to the uppermost second semiconductor chip 510-8 may be conductive bumps, and the remaining second vertical interconnectors 520B that are connected to the remaining second semiconductor chips 510-5 to 510-7 may be vertical bonding wires.

The molding layer 530 may cover the first and second chip stacks 510A and 510B and the first and second vertical interconnectors 520A and 520B. In addition, through one surface 531 of the molding layer 530, first and second surfaces 521A and 521B of ends of the first and second vertical interconnectors 520A and 520B may be exposed. The ends with the first and second surfaces 521A and 521B may be positioned opposite to ends that are connected to the first and second chip pads 515A and 515B.

The redistribution layer 540 may be formed over the one surface 531 of the molding layer 530. The redistribution layer 540 may include first and second redistribution lands 544LA and 544LB, which are formed over the one surface 531 of the molding layer 530 to contact the first and second surfaces 521A and 521B of the first and second vertical interconnectors 520A and 520B, respectively. Accordingly, the redistribution layer 540 and the first and second vertical interconnectors 520A and 520B may be electrically connected. In the present embodiment, the redistribution layer 540 may include a first redistribution insulating layer 542, first and second redistribution conductive layers 544A and 544B that are formed over the first redistribution insulating layer 542 and connected to the first and second surfaces 521A and 521B of the first and second vertical interconnectors 520A and 520B, respectively, through openings of the first redistribution insulating layer 542, and a second redistribution insulating layer 546 covering the first redistribution insulating layer 542 along with the first and second redistribution conductive layers 544A and 544B. The first and second redistribution lands 544LA and 544L3 may be portions of the first and second redistribution conductive layers 544A and 544B, respectively.

First and second external connection terminals 550A and 550B may be connected to the first and second redistribution conductive layers 544A and 544B, respectively, through openings formed in the second redistribution insulating layer 546.

According to the semiconductor package of the present embodiment, all of the effects of the above-described embodiments may be obtained.

Also, because a plurality of semiconductor chips are included in one semiconductor package, a semiconductor package that is capable of high performance/high-volume data processing may be implemented.

Furthermore, the first chip stack 510A and the second chip stack 510B may be recognized and operated separately from each other in one semiconductor package. In other words, a semiconductor package that is capable of operating in a 2-channel operation may be implemented.

A semiconductor package including a plurality of stacked semiconductor chips has been exemplarily described in FIGS. 7A to 8B, but the present disclosure is not limited thereto. In a semiconductor package of the present disclosure, as long as a plurality of semiconductor chips are stacked with an active surface facing a redistribution layer to expose all the chip pads of the plurality of semiconductor chips, the number, stacking form, offset direction, or the like of stacked semiconductor chips may be modified in various ways.

According to the above embodiments of the present disclosure, it may be possible to provide a semiconductor package with a thin thickness while satisfying the demand for high performance and high-volume data processing. Furthermore, it may be possible to reduce the possibility of occurrence of defects in the processes.

Figure 9:
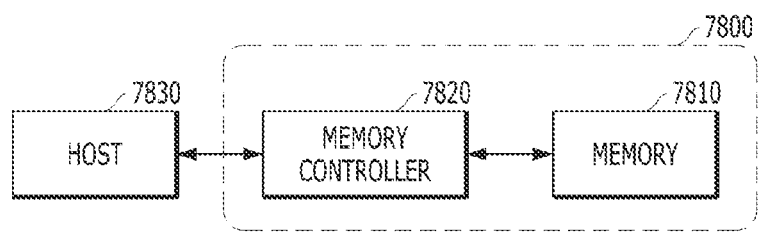
FIG. 9 shows a block diagram illustrating an electronic system employing a memory card including a semiconductor package, according to an embodiment.

FIG. 9 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 10:
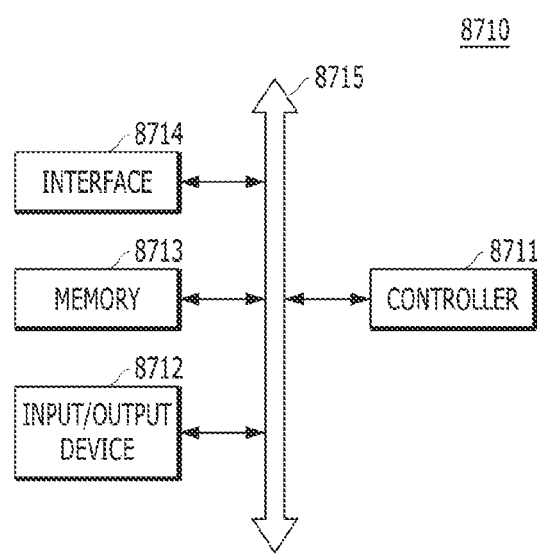
FIG. 10 shows a block diagram illustrating another electronic system including a semiconductor package, according to an embodiment.

FIG. 10 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 and the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, t will be apparent to those skilled in the art that various changes and modifications may be made without departing from the spirit and scope of the present teachings as defined in the following claims.

What is claimed is:

1. A semiconductor package, comprising:
   at least one semiconductor chip disposed in such a way that an active surface with chip pads faces a redistribution layer;
   bonding wires straightly extending in a vertical direction from the chip pads toward the redistribution layer, wherein each of the bonding wires has a first end portion that is connected to a corresponding chip pad and a second end portion that is disposed on an opposite end of each bonding wire in relation to the first end portion; and
   a molding layer covering the semiconductor chip and the bonding wires while exposing a surface of the second end portion of each bonding wire,
   wherein the redistribution layer is formed over the molding layer, the redistribution layer having a redistribution land that is in contact with the surface of the second end portion, and
   wherein the first end portion and the second end portion has a hemispherical shape,
   wherein a width of the first end portion is greater than a width of an extension portion between the first end portion and the second end portion of each bonding wire,
   wherein a width of the surface of the second end portion is greater than the width of the extension portion,
   wherein the extension portion has a same width at all portions,
   wherein the width of the surface of the second end portion is greater than widths of any other portion of the second end portion in a horizontal direction,
   wherein a top surface of the molding layer and the surface of the second end portion of each bonding wire are co-planar, and
   wherein the width of the surface of the second portion is greater than a width of the redistribution land.

2. The semiconductor package according to claim 1, wherein each of the redistribution lands is aligned with each of the chip pads, respectively.

3. The semiconductor package according to claim 1, wherein the second end portion is not fully aligned with its corresponding chip pad.

4. The semiconductor package according to claim 1, wherein the redistribution layer comprises:

a first redistribution insulating layer disposed over the molding layer with an opening that exposes the surface of the second end portion;

a redistribution conductive layer formed over the first redistribution insulating layer, filling the opening to form the redistribution land; and a second redistribution insulating layer covering the first redistribution insulating layer and the redistribution conductive layer.

5. The semiconductor package according to claim 1,
wherein the at least one semiconductor chip includes a plurality of semiconductor chips that are stacked in a vertical direction, and
wherein the plurality of semiconductor chips are stacked in such a way that all the chip pads of each of the plurality of semiconductor chips are exposed.

6. The semiconductor package according to claim 5,
wherein each of the plurality of semiconductor chips include the same memory chip.

7. The semiconductor package according to claim 5,
wherein the chip pads of each of the plurality of semiconductor chips are disposed in an edge region of one side of each of the plurality of semiconductor chips, and
wherein the plurality of semiconductor chips are offset-stacked in a direction away from the one side.

8. The semiconductor package according to claim 5,
wherein the plurality of semiconductor chips comprises:
a plurality of first semiconductor chips offset-stacked in a direction that is away from one side; and
a plurality of second semiconductor chips disposed over the plurality of first semiconductor chips and offset-stacked in a direction away from an other side that is opposite to the one side,
wherein the chip pads of each of the plurality of first semiconductor chips are disposed in an edge region of the one side of each of the plurality of first semiconductor chips, and
wherein the chip pads of each of the plurality of second semiconductor chips are disposed in an edge region of the other side of each of the plurality of second semiconductor chips.

9. The semiconductor package according to claim 8,
wherein the second semiconductor chip has a state in which the first semiconductor chip is rotated 180 degrees about an axis that is parallel to the vertical direction.

10. A semiconductor package, comprising:
at least one semiconductor chip disposed in such a way that an active surface with chip pads faces a redistribution layer;
bonding wires straightly extending in a vertical direction from the chip pads toward the redistribution layer, wherein each of the bonding wires has a first end portion that is connected to a corresponding chip pad and a second end portion that is disposed on an opposite end of each bonding wire in relation to the first end portion; and
a molding layer covering the semiconductor chip and the bonding wires while exposing a surface of the second end portion of each bonding wire,
wherein the redistribution layer is formed over the molding layer, the redistribution layer having a first redistribution land that is in contact with the surface of the second end portion, and
wherein the first end portion and the second end portion has a hemispherical shape,
wherein a width of the first end portion is greater than a width of an extension portion between the first end portion and the second end portion of each bonding wire,
wherein a width of the surface of the second end portion is greater than the width of the extension portion between the first end portion and the second end portion of each bonding wire,
wherein the extension portion has a same width at all portions,
wherein the width of the surface of the second end portion is greater than widths of any other portion of the second end portion in a horizontal direction,
wherein a top surface of the molding layer and the surface of the second end portion of each bonding wire are co-planar, and
wherein the width of the surface of the second portion is greater than a width of the first redistribution land.

11. The semiconductor package according to claim 10, further comprising:
an intermediate semiconductor chip between the semiconductor chip and the redistribution layer, and
a metal bump, and
wherein the intermediate semiconductor chip includes a chip pad facing the redistribution layer,
wherein the redistribution layer includes a second redistribution land,
wherein the metal bump is in contact with the chip pad of the intermediate semiconductor chip and in contact with the second redistribution land.

12. A semiconductor package, comprising:
a first semiconductor chip disposed over a redistribution layer,
wherein the first semiconductor chip has a first chip pad,
wherein the redistribution layer has a first redistribution land and a second redistribution land,
wherein the first chip pad and the first redistribution land vertically aligned with and facing each other;
a second semiconductor chip offset-stacked on the first semiconductor chip to expose the first chip pad,
wherein the second semiconductor chip has a second chip pad,
wherein the second chip pad and the second redistribution land vertically aligned with and facing each other;
a bonding wire straightly extending in a vertical direction from the first chip pads toward the first redistribution land,
wherein the bonding wire has a first end portion on the first chip pad, a second end portion on the first redistribution land, and an extension portion between the first end portion and the second end portion; and
a molding layer over the redistribution layer,
wherein the molding layer covering and surrounding the first and second semiconductor chips and the bonding wire,
wherein a top surface of the second end portion of the bonding wire is exposed on a top surface of the molding layer,
wherein the top surface of the second end portion of the bonding wire and the top surface of the molding layer are co-planar,
wherein the first end portion and the second end portion has a hemispherical shape, wherein widths of the first and second end portions are greater than a width of the extension portion, respectively, wherein the extension portion has a same width at all portions, wherein the width of the surface of the second portion is greater than a width of the first redistribution land.

13. The semiconductor package according to claim 10, further comprising:

a metal bump between the second chip pad of the second semiconductor chip and the second redistribution land of the redistribution layer to be in contact with both the second chip pad to the second redistribution land.

* * * * *